(12) United States Patent
Chandrashekharaiah et al.

(10) Patent No.: US 12,019,108 B2
(45) Date of Patent: Jun. 25, 2024

(54) GROUND CONNECTION DETECTION IN AN ELECTRONIC EQUIPMENT

(71) Applicant: Cisco Technology, Inc., San Jose, CA (US)

(72) Inventors: Madhuri Chandrashekharaiah, Bangalore (IN); Rohit Dev Gupta, Bangalore (IN); Paolo Sironi, Gallarate (IT); Joel R. Goergen, Soulsbyville, CA (US); Chad M. Jones, Doylestown, OH (US); Jason D. Potterf, Austin, TX (US)

(73) Assignee: Cisco Technology, Inc., San Jose, CA (US)

( * ) Notice: Subject to any disclaimer, the term of this patent is extended or adjusted under 35 U.S.C. 154(b) by 377 days.

(21) Appl. No.: 17/445,999

(22) Filed: Aug. 26, 2021

(65) Prior Publication Data
US 2023/0065681 A1    Mar. 2, 2023

(51) Int. Cl.
*G01R 27/20*    (2006.01)
*G01R 31/56*    (2020.01)
*H01R 4/34*    (2006.01)
*H01R 4/64*    (2006.01)

(52) U.S. Cl.
CPC .......... *G01R 27/205* (2013.01); *G01R 31/56* (2020.01); *H01R 4/34* (2013.01); *H01R 4/64* (2013.01)

(58) Field of Classification Search
CPC ........ G01R 27/205; G01R 31/56; H01R 4/66; H01R 4/38
See application file for complete search history.

(56) References Cited

U.S. PATENT DOCUMENTS

| | | | |
|---|---|---|---|
| 3,736,394 A | 5/1973 | Rumbaugh | |
| 3,753,261 A | 8/1973 | Thaxton | |
| 3,984,765 A * | 10/1976 | Rocci, Jr. | G01R 31/52 324/508 |
| 4,111,516 A | 9/1978 | Wireman | |
| 4,394,615 A | 7/1983 | Rocci, Jr. | |
| 5,895,630 A * | 4/1999 | Skaborn | G01N 35/1011 422/63 |

(Continued)

OTHER PUBLICATIONS

Civacon, "Civacon Ground Verification Rack Monitor System and Associated Equipment," Installation and Wiring Instructions Manual, Dated Jan. 2011, pp. 1-14.

*Primary Examiner* — Jeff W Natalini
(74) *Attorney, Agent, or Firm* — Patterson + Sheridan, LLP

(57) ABSTRACT

Embodiments presented in this disclosure generally relate to a ground device. More specifically, embodiments disclosed herein are directed to a grounding device for indicating whether there is proper grounding for electrical equipment. One embodiment presented in this disclosure provides an apparatus. The apparatus generally includes a lug configured to be coupled to a physical ground node, the lug having one or more bolts for coupling the lug to a surface of a plate such that the physical ground node is electrically coupled to an electrical ground node. The apparatus also includes a sensing circuit configured to detect whether the physical ground node is electrically coupled to the electrical ground node, and provide an indication of whether the physical ground node is electrically coupled to the electrical ground node based on the detection.

20 Claims, 8 Drawing Sheets

(56) References Cited

U.S. PATENT DOCUMENTS

| | | | |
|---|---|---|---|
| 2002/0148624 A1* | 10/2002 | Gobelhaider | G01R 27/205 174/6 |
| 2004/0209498 A1* | 10/2004 | Hatakeyama | H01R 13/652 439/97 |
| 2008/0129311 A1 | 6/2008 | Schuster et al. | |
| 2010/0203748 A1* | 8/2010 | Wason | H01R 4/64 439/98 |
| 2018/0138857 A1* | 5/2018 | Davies | H02S 40/34 |
| 2020/0088206 A1* | 3/2020 | McGaugh | F04D 29/626 |
| 2021/0231735 A1* | 7/2021 | Aust | G01R 27/025 |
| 2022/0057282 A1* | 2/2022 | Kolberg | G01N 29/343 |

\* cited by examiner

GROUND CONNECTION DETECTION IN AN ELECTRONIC EQUIPMENT

TECHNICAL FIELD

Embodiments presented in this disclosure generally relate to a grounding device. More specifically, embodiments disclosed herein are directed to a grounding device for indicating whether there is proper grounding for electrical equipment.

BACKGROUND

A ground connection is used to provide electrical connection to physical ground for electronic circuits. The ground connection serves various purposes such as serving as a reference potential for the electronics circuits and providing a common return path for electric current. Without a proper ground connection, buildup of static electricity may occur resulting in a shock hazard to humans or electrical components. Moreover, without proper ground connection, various electrical circuits may malfunction, resulting in increased cost to the consumer in replacement, reinstallation and returns, failure analysis, repair cost, depot refill, reshipment cost to an equipment manufacturer.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate typical embodiments and are therefore not to be considered limiting; other equally effective embodiments are contemplated.

To facilitate understanding, identical reference numerals have been used, where possible, to designate identical elements that are common to the figures. It is contemplated that elements disclosed in one embodiment may be beneficially used in other embodiments without specific recitation.

DESCRIPTION OF EXAMPLE EMBODIMENTS

Overview

Figure 1:
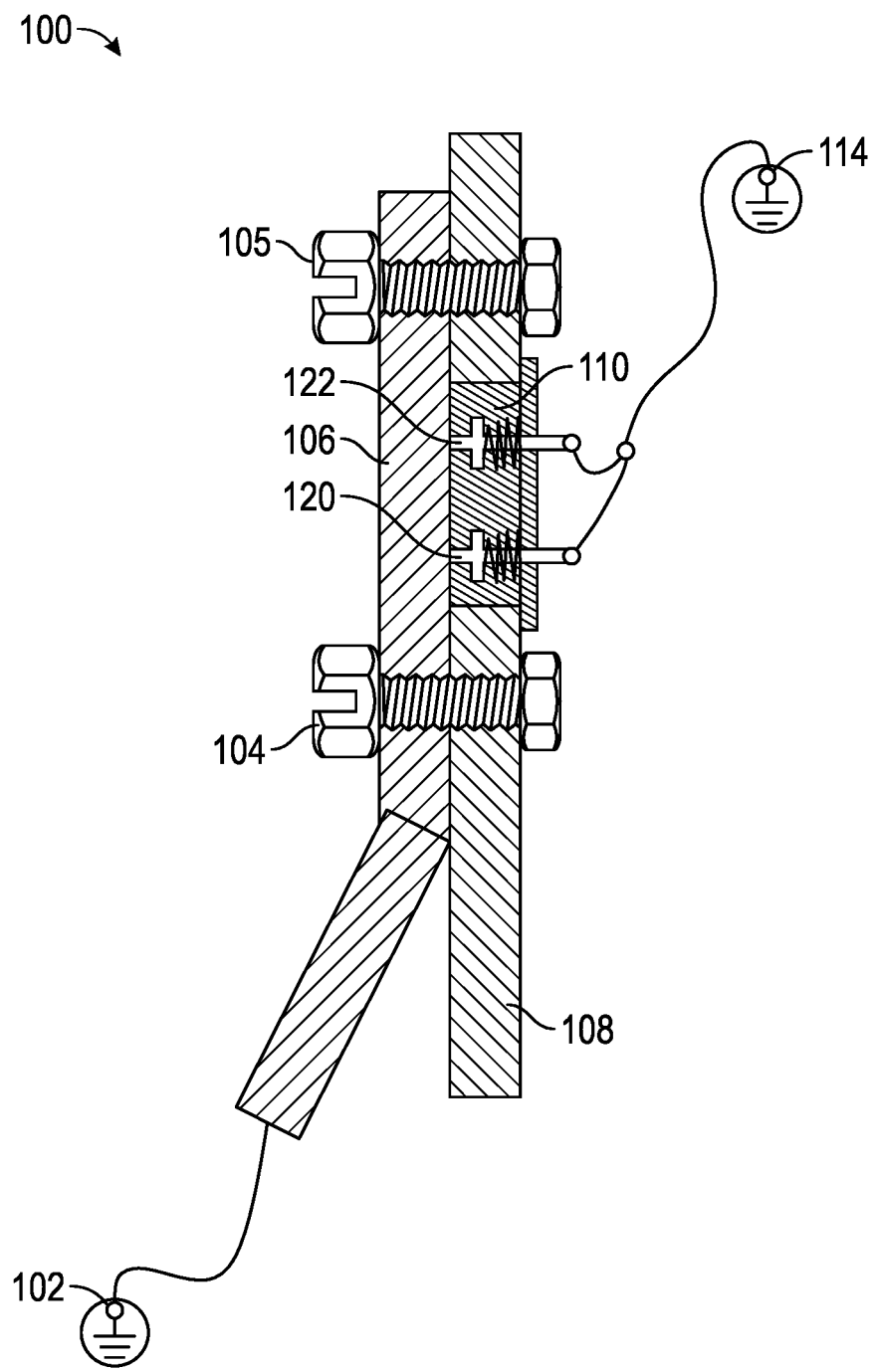
FIG. 1 illustrates a grounding device including a lug coupled to a surface of a plate to facilitate connection between an electrical ground for electronic equipment and physical ground, in accordance with certain embodiments of the present disclosure.

One embodiment presented in this disclosure provides an apparatus. The apparatus generally includes a lug configured to be coupled to a physical ground node, the lug having one or more bolts for coupling the lug to a surface of a plate such that the physical ground node is electrically coupled to an electrical ground node. The apparatus also includes a sensing circuit configured to detect whether the physical ground node is electrically coupled to the electrical ground node, and provide an indication of whether the physical ground node is electrically coupled to the electrical ground node based on the detection.

One embodiment presented in this disclosure provides a method. The method generally includes detecting whether a physical ground node is electrically coupled to an electrical ground node, wherein a lug is coupled to the physical ground node, the lug having one or more bolts for coupling the lug to a surface of a plate such that the physical ground node is electrically coupled to the electrical ground node, and providing an indication of whether the physical ground node is electrically coupled to the electrical ground node based on the detection.

One embodiment presented in this disclosure provides an apparatus. The apparatus generally includes means for detecting whether a physical ground node is electrically coupled to an electrical ground node, wherein a lug is coupled to the physical ground node, the lug having one or more bolts for coupling the lug to a surface of a plate such that the physical ground node is electrically coupled to the electrical ground node, and means for providing an indication of whether the physical ground node is electrically coupled to the electrical ground node based on the detection.

Example Embodiments

Equipment Failure due to poor or no grounding connection for electrical equipment is a problem resulting in equipment returns, failure analysis, high repair costs, depots refill and reshipment costs. Equipment failure due to poor or no ground connection occurs despite sharing with consumers grounding best practices in install guides. Currently, there is no reliable way to identify the quality of a ground connection. Connection to ground is facilitated using rack mount screws, in some implementations. However, relying on rack mount screws for grounding is not recommended, as it may become weak over time due to vibrations and make ground connection ineffective.

If electronic equipment is not properly grounded, electrical damage due to power surge or lightning can occur leading to issues like component damage as a result of electro-static discharge (ESD), data corruption, system lockup, radio failure, frequent reboots, and many more as a consequence. As an example, if there is a component failure within an access point which might be installed high up on a ceiling or on an outdoor pole, replacing the equipment results in increased costs.

Certain embodiments of the present disclosure are directed to electrical and mechanical techniques for verifying poor grounding connection of electrical equipment. In some embodiments, electrical functionality of the electrical equipment is enabled (e.g., automatically) only after a valid test indicates a proper ground connection, saving the equipment from electrical damage. As such, service requests to an equipment manufacturer, shipments of failed units, re-design costs, and replacement and reinstallation charges are reduced, while also reducing network downtime for consumers.

FIG. 1 illustrates a grounding device 100 including a lug 106 coupled to a surface and spring loaded pins to facilitate connection between an electrical ground node 114 for electronic equipment and a physical ground node 102, in accordance with certain embodiments of the present disclosure. As shown, a lug 106 may include apertures for bolts 104, 105 for coupling of the lug 106 to a plate 108. The plate 108 is a chassis of electronic equipment to be coupled to physical ground, in some cases. As shown, lug 106 is coupled to physical ground via node 102, facilitating the grounding of the equipment chassis. The physical ground node is a ground connection at a rack post, in some implementations. In other words, the lug 106 is coupled to a rack post connected to physical ground.

As shown, insulating material 110 serves as a housing for spring-loaded contacts 120, 122 that are coupled to the electrical ground node 114 of the electronic equipment to be grounded. In other words, contacts 120, 122 are spring-loaded such that they provide sufficient force against lug 106 upon coupling of lug 106 to plate 108, facilitating proper electrical coupling between physical ground and electrical ground of electronic equipment. Coupling between the lug 106 and the surface of plate 108 is facilitated by the pins loaded with spring, allowing usage of a dual hole lug (e.g., typically used in high power telecom/networking equipment). The two hole lug may be used to detect the coupling/contact with the system chassis surface (e.g., surface of plate 108).

Figure 2:
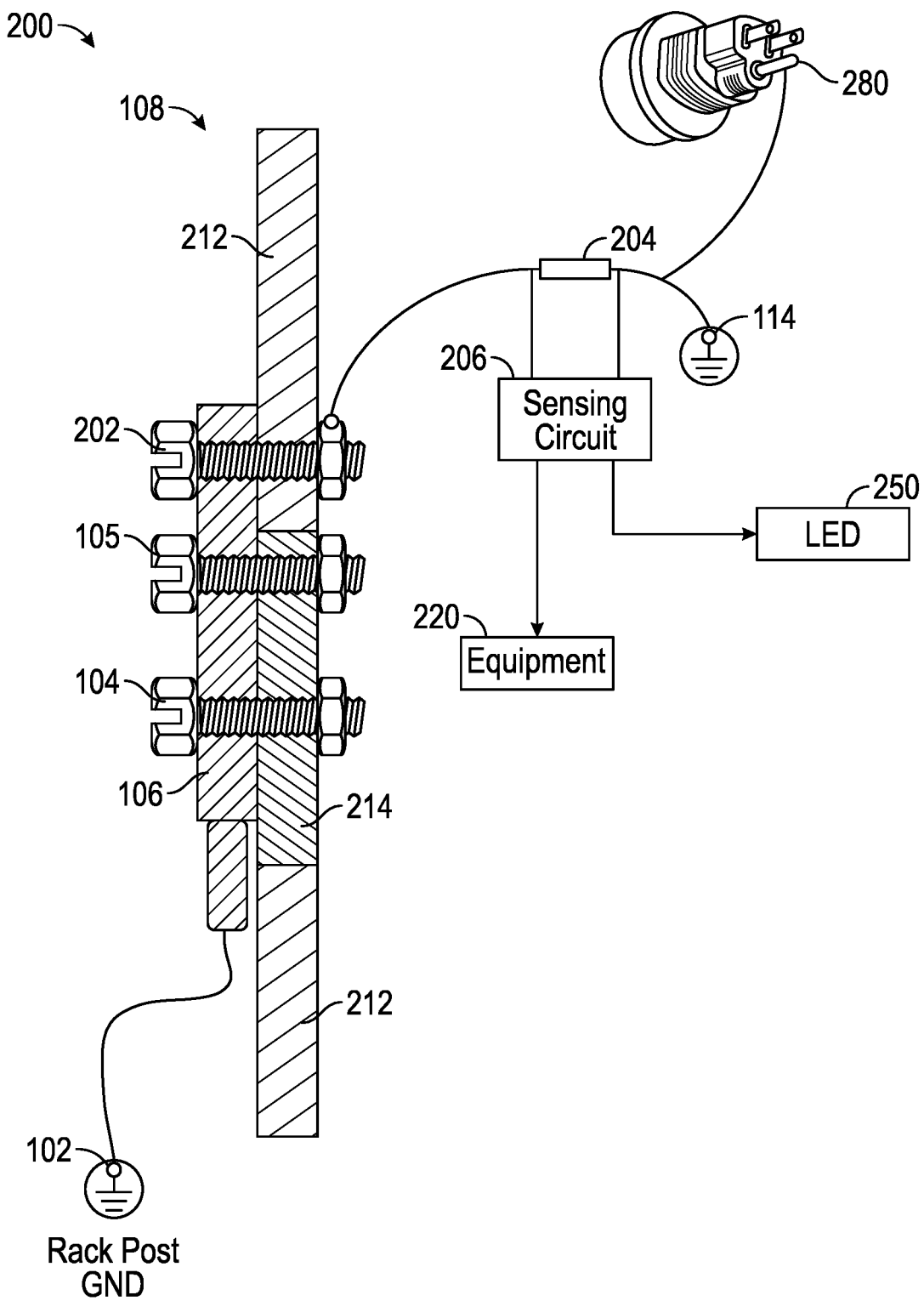
FIG. 2 illustrates a grounding device including a sensing circuit used to detect whether there is proper coupling between an electrical ground and physical ground, in accordance with certain embodiments of the present disclosure.

FIG. 2 illustrates a grounding device 200, including a sensing circuit used to determine proper coupling between an electrical ground node and physical ground, in accordance with certain embodiments of the present disclosure. As shown, lug 106 is coupled to plate 108 via bolts 104, 105, 202. The plate 108 includes a metal insert 214 with a plastic enclosure 212 around portions of the plate 108, as shown. A bolt 202 is coupled to the electrical ground node 114, and the electrical ground node 114 is coupled to physical ground through a prong 280 of a power cord, as shown.

A sensing circuit 206 senses an impedance 204 (e.g., resistance) between bolt 202 and the electrical ground node 114. Based on the sensed impedance, the sensing circuit provides an indication of whether there is a proper coupling between the physical ground node 102 and the electrical ground node 114. For example, a sensed resistance that is less than a resistance threshold may indicate proper grounding. If the lug 106 is not properly coupled to plate 108 via bolt 202, the sense circuit 206 will sense high resistance (e.g., a resistance greater than the resistance threshold) between the electrical ground node 114 and the bolt 202, triggering an indication of improper grounding.

In some embodiments, the sensing circuit 206 may output an indication of whether there is proper grounding to electronic equipment 220. In some cases, the electronic equipment 220 is enabled (e.g., powered on) only if there is proper grounding as indicated by the sensing circuit 206.

In some embodiments, if improper grounding is detected, an indication of the improper grounding is provided to a user. The indication to the user is via a notification component 250, which may be a light-emitting diode (LED) or an alarm. For example, the sensing circuit 206 sets a color of an LED to red that indicates to the user that the grounding is improper, or sets the color of the LED to green that indicates to the user that the grounding is proper.

Figure 3:
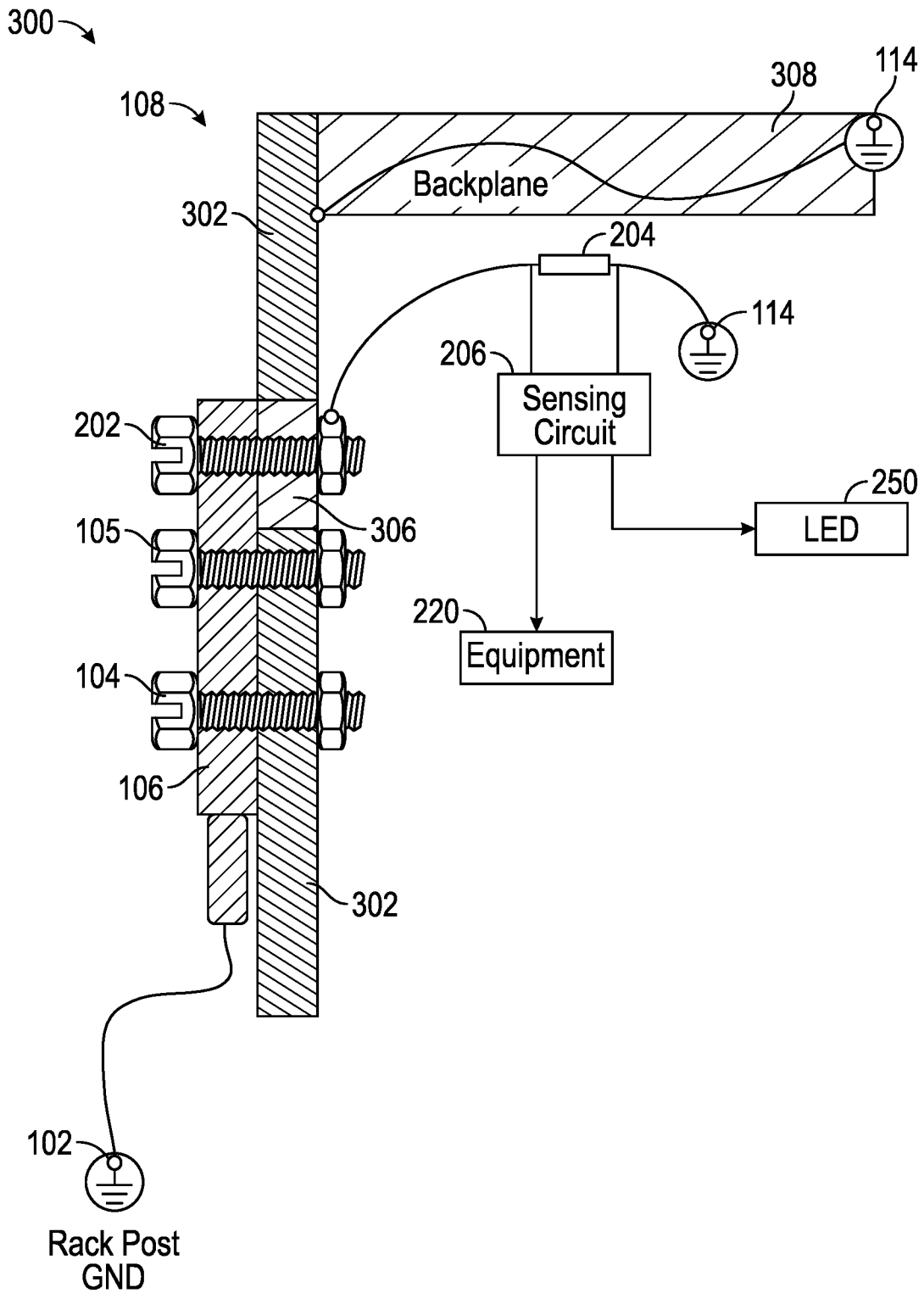
FIG. 3 illustrates a grounding device including a lug coupled to a plate in a sheet metal enclosure, in accordance with certain embodiments of the present disclosure.

FIG. 3 illustrates a grounding device 300, including a lug 106 coupled to a plate 108 in a sheet metal enclosure 302, in accordance with certain embodiments of the present disclosure. As shown, bolt 202 couples the lug 106 to an insulating sheet 306 of the plate 108, portions of which are covered using sheet metal enclosure 302. The sheet metal enclosure 302 is coupled to electrical ground node 114 through a backplane 308 (e.g., an electrical connector). The sheet metal enclosure 302 is grounded to provide shielding and reduce static build-up.

The sensing circuit 206 senses an impedance 204 (e.g., resistance) between bolt 202 and electrical ground node 114 when the bolt is coupled the lug 106 to plate 108, as shown. As described, based on the sensed impedance, the sensing circuit 206 provides an indication of whether there is proper grounding. For example, as described herein, if improper grounding is detected, an indication of the improper grounding is provided to a user. The indication to the user is via a notification component 250, which may be an LED or an alarm. In some embodiments, the sensing circuit 206 may send an indication of whether there is proper grounding to electronic equipment 220, where the electronic equipment 220 is enabled (e.g., powered on) only if there is proper grounding as indicated by the sensing circuit 206.

Figure 4:
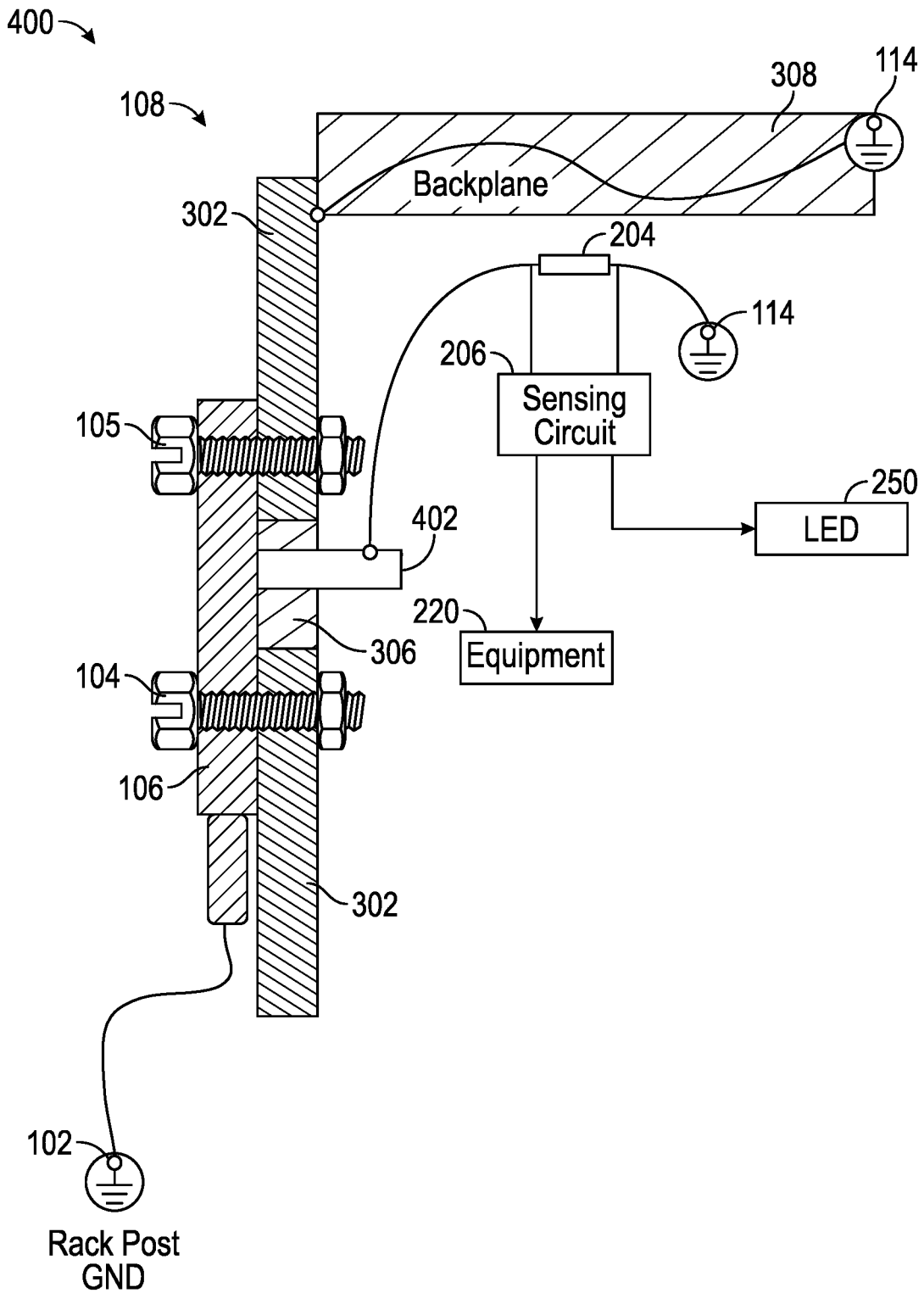
FIG. 4 illustrates a grounding device having a lug coupled to a plate with a press-fit metal insert, in accordance with certain embodiments of the present disclosure.

FIG. 4 illustrates a grounding device 400 having a lug 106 coupled to a plate 108 with a press-fit metal insert 402, in accordance with certain embodiments of the present disclosure. Once lug 106 is coupled to plate 108, a user may press the insert 402 into an aperture in plate 108 (e.g., an aperture through the insulating sheet 306) such that the press-fit metal insert 402 electrically contacts the lug 106. As shown, the press-fit metal insert 402 is coupled to electrical ground node 114.

The sensing circuit 206 senses an impedance 204 between the press-fit metal insert 402 and electrical ground node 114, as shown. Moreover, the metal enclosure 302 is coupled to electrical ground node 114 through the backplane 308, providing electrical coupling between electrical ground node 114 and physical ground node 102 through the lug 106. The sensing circuit 206 senses the impedance 204 between electrical ground node 114 and the press-fit metal insert 402 to detect whether there is proper grounding between physical ground node 102 and electrical ground node 114.

Figure 5:
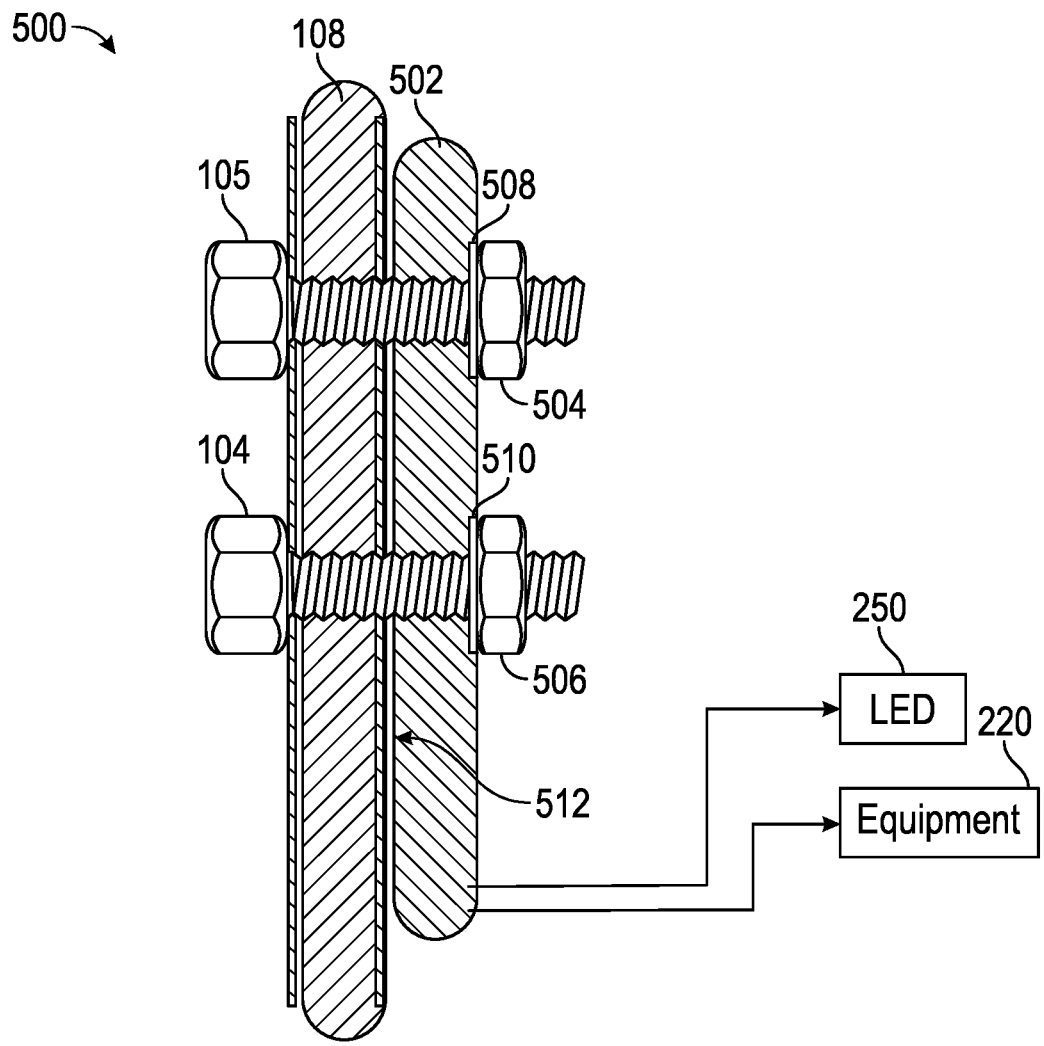
FIG. 5 illustrates a grounding device including a circuit board used to detect proper grounding, in accordance with certain embodiments of the present disclosure.

FIG. 5 illustrates a grounding device 500 including a circuit board used to detect proper grounding, in accordance with certain embodiments of the present disclosure. As shown, a circuit board 502 (e.g., printed circuit board (PCB)) is coupled to plate 108 (e.g., chassis). In some embodiments, the surface 512 of the circuit board includes insulative material. As shown, the bolts 104, 105 pass through plate 108 and circuit board 502 and are fastened using nuts 504, 506, respectively. As described herein, the plate 108 is electrically coupled to electrical ground, and the one or more of bolts 104, 105 are electrically coupled to physical ground such that insertion of the bolts 104, 105 in the plate 108 facilitates electrical coupling between electrical ground and physical ground.

The circuit board 502 includes conductive contacts 508, 510 electrically coupled to respective nuts 504, 506. The circuit board 502 may sense the impedance (e.g., resistance) between nuts 504, 506 (e.g., resistance between contacts 508, 510) to determine whether bolts 104, 105 are properly coupled to plate 108 (e.g., chassis) such that the plate 108 is grounded. In other words, if the bolts 104, 105 are not inserted, the circuit board 502 senses a high impedance indicating improper grounding. As described, an indication of whether there is proper grounding may be sent to a user (e.g., via a notification component 250) and/or electrical equipment 220.

Figure 6:
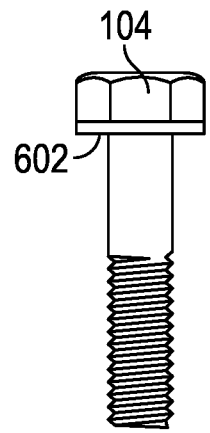
FIG. 6 illustrates a deformable washer coupled to a bolt, in accordance with certain embodiments of the present disclosure.

FIG. 6 illustrates a deformable washer 602 coupled to a bolt 104, in accordance with certain embodiments of the present disclosure. In the various implementations described herein, one or more bolts are used to provide electrical coupling between electrical ground and physical ground. If a bolt is not properly torqued down, insufficient electrical coupling between electrical and physical ground may occur. In some embodiments, one or more bolts (e.g., bolts 104, 105) coupling the lug 106 to the plate 108 may include a deformable washer 602. The deformable washer 602 is compression calibrated to meet a torque specification. In some embodiments, the deformable washer 602 is disposed between plate 108 and the nut (e.g., nut 504) instead of being between the lug and the top of the bolt, as shown in FIG. 6.

Figure 7:
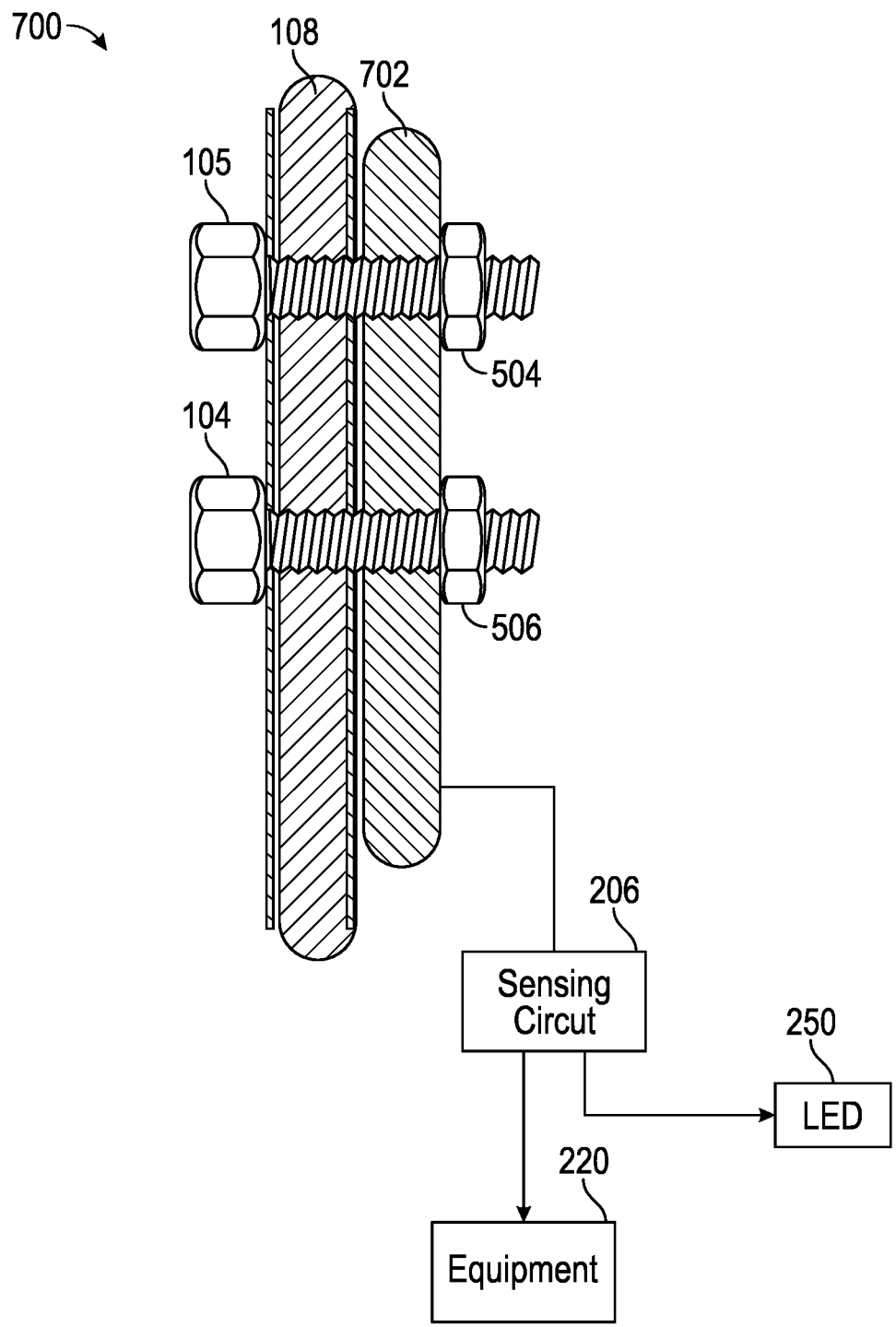
FIG. 7 illustrates a grounding device including a strain gauge used to detect proper grounding, in accordance with certain embodiments of the present disclosure.

FIG. 7 illustrates a grounding device 700, including a strain gauge 702 used to detect proper grounding, in accordance with certain embodiments of the present disclosure. As shown, the strain gauge 702 is coupled to plate 108 (e.g., chassis). The strain gauge 702 detects the amount of strain being applied via bolts 104, 105 and nuts 504, 506. For example, a resistance associated with the strain gauge 702 varies based on the amount of force applied to the strain gauge 702. The resistance associated with the strain gauge 702 is measured by a sensing circuit 206 to determine whether bolts 104, 105 have been properly fastened as an indicator of proper grounding. As described, an indication of whether there is proper grounding may be sent to a user (e.g., via a notification component 250) and/or electrical equipment 220.

Figure 8A:
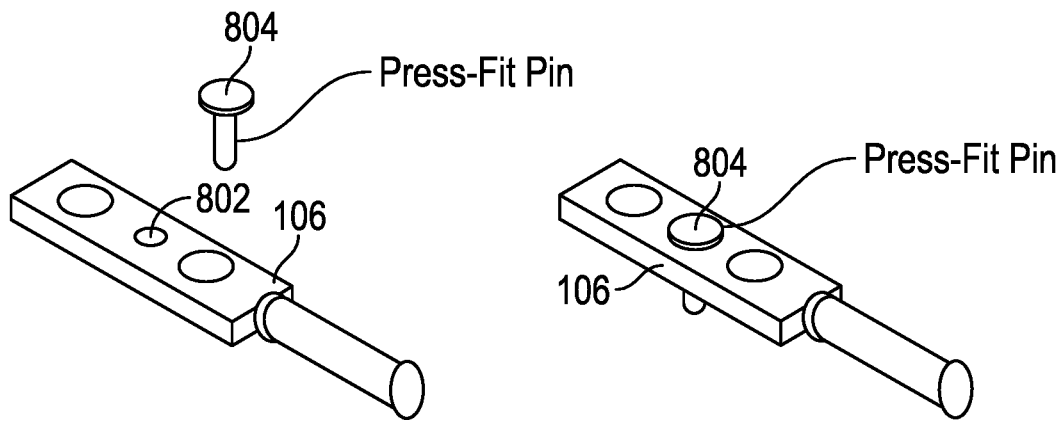
FIGS. 8A and 8B illustrate a grounding device implemented with a press-fit pin inserted into a lug, in accordance with certain embodiments of the present disclosure.
Figure 8B:
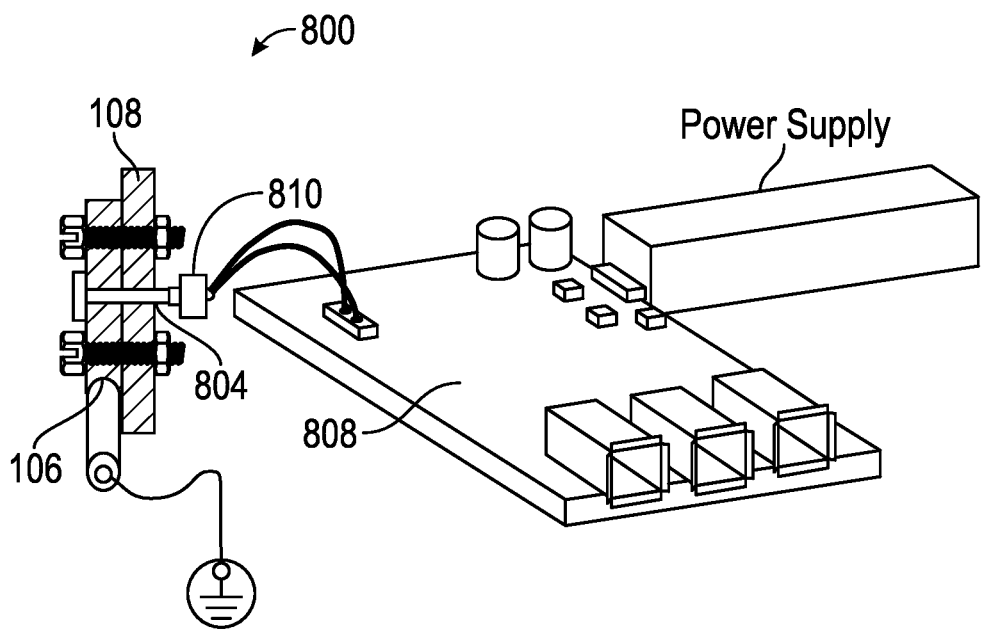

FIGS. 8A and 8B illustrate a grounding device 800 implemented with a press-fit pin 804 inserted into a lug 106, in accordance with certain embodiments of the present disclosure. As shown, the lug 106 may have two holes for bolts to couple the lug to a plate (e.g., chassis) as described herein. The lug 106 also includes an aperture 802 in which the press-fit pin 804 is inserted, as shown. The insertion of the press-fit pin 804 facilitates detection of the lug being coupled to plate 108 for grounding. For example, as shown in FIG. 8B, the press-fit pin 804, when inserted, enables (e.g., activates) a mechanical switch 810 which is used to enable (e.g., activate) a notification component for indicating proper grounding to a user and/or activate electrical equipment as described. For example, the mechanical switch 810 shorts two wires coupled to a circuit 808, where the shorting of the wires is detected by the circuit 808 and turns on an LED. The LED indicates to the user that lug 106 has been coupled to plate 108. In some embodiments, the insertion of the lug 106 enables the operation of electrical equipment (e.g., equipment 220 shown in FIG. 7), as described herein.

Figure 9:
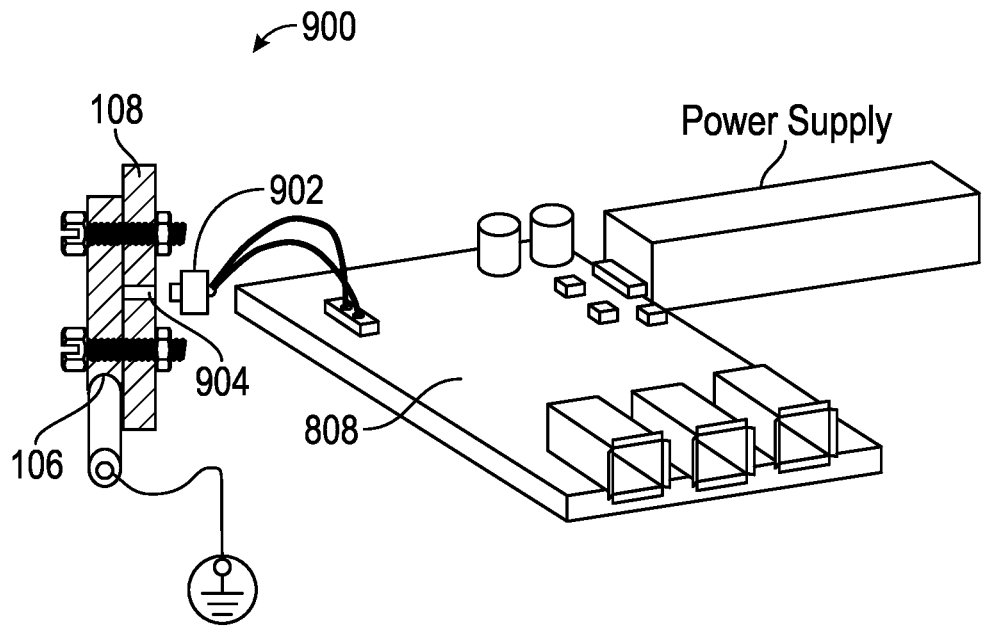
FIG. 9 illustrates a grounding device having an optical switch used to detect whether a lug is coupled to a plate, in accordance with certain embodiments of the present disclosure.

FIG. 9 illustrates a grounding device 900 having an optical switch 902 used to detect whether a lug 106 is coupled to the plate 108, in accordance with certain embodiments of the present disclosure. As shown, plate 108 includes an aperture 904. The optical switch 902 provides an optical signal through hole 904, and detects a reflection of the optical signal from lug 106 when lug 106 is coupled to plate 108. If the reflection is detected, an indication that lug 106 is coupled to plate 108 is provided. For example, the optical switch 902 may activate an LED (e.g., by shorting two wires coupled to circuit 808), and/or enable operation of electrical equipment (e.g., equipment 220 shown in FIG. 7), as described herein.

Figure 10:
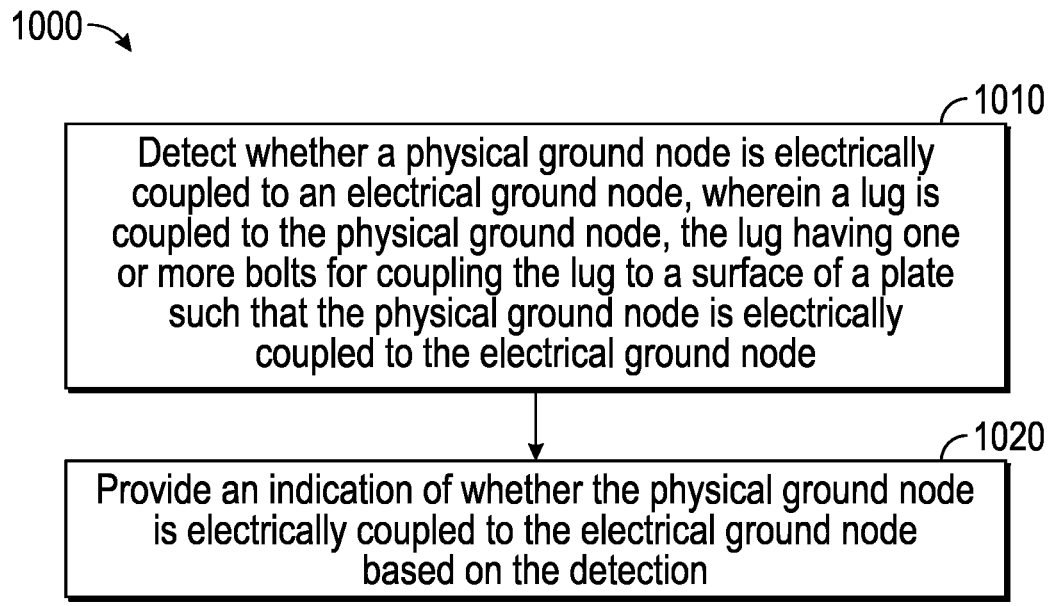
FIG. 10 is a flow diagram illustrating example operations for ground connection testing, in accordance with certain embodiments of the present disclosure.

FIG. 10 is a flow diagram illustrating example operations 1000 for ground connection testing, in accordance with certain embodiments of the present disclosure. The operations 1000 may be performed by a grounding device, such as any one of the grounding devices 100, 200, 300, 400, 500, 700, 800, and 900.

The operations 1000 begin, at block 1010, by the grounding device detecting whether a physical ground node (e.g., physical ground node 102) is electrically coupled to an electrical ground node (e.g., electrical ground node 114). In some embodiments, a lug (e.g., lug 106) is coupled to the physical ground node, the lug having one or more bolts (e.g., bolts 104, 105, 202) for coupling the lug to a surface of a plate (e.g., plate 108) such that the physical ground node is electrically coupled to the electrical ground node. The surface of the plate includes a surface of an equipment chassis, in some embodiments.

At block 1020, the grounding device provides an indication of whether the physical ground node is electrically coupled to the electrical ground node based on the detection. In some embodiments, the electrical ground node is for electrical equipment, such as electrical equipment 220 described with respect to FIG. 2. In some embodiments, providing the indication includes enabling the electrical equipment in response to detection of the physical ground node being electrically coupled to the electrical ground node.

In some embodiments, the one or more bolts comprise a first bolt (e.g., bolt 104) and a second bolt (e.g., bolt 105). In some implementations, detecting whether the physical ground node is electrically coupled to the electrical ground node includes detecting whether the first bolt is electrically coupled to the second bolt.

In some embodiments, the grounding device couples, via one or more spring-loaded contacts (e.g., contacts 120, 122), the electrical ground node to the lug when the lug is coupled to the surface. In some embodiments, detecting whether the physical ground node is electrically coupled to the electrical ground node includes detecting an electrical coupling between the first physical ground node and the electrical ground node via a circuit (e.g., sensing circuit 206). In one example, detecting the electrical coupling includes sensing an impedance (e.g., impedance 204) of a path between the physical ground node and the electrical ground node. Sensing the impedance may include sensing a voltage at the one or more bolts.

In some embodiments, one or more deformable washers (e.g., deformable washer 602) are coupled to the one or more bolts. For example, the one or more deformable washers are compression calibrated to meet a specification of an amount of torque on the one or more bolts.

In some embodiments, detecting whether the physical ground node is electrically coupled to the electrical ground node includes sensing, via a pressure sensor (e.g., strain gauge 702), an amount of torque on the one or more bolts. In some embodiments, providing the indication includes providing an indication of whether the lug is coupled to the surface via an LED or an alarm (e.g., the notification component 250). In some embodiments, the detection at block 1010 may be performed via a mechanical switch (e.g., mechanical switch 810) or an optical sensor (e.g., optical switch 902).

In the current disclosure, reference is made to various embodiments. However, the scope of the present disclosure is not limited to specific described embodiments. Instead, any combination of the described features and elements, whether related to different embodiments or not, is contemplated to implement and practice contemplated embodiments. Additionally, when elements of the embodiments are described in the form of "at least one of A and B," it will be understood that embodiments including element A exclusively, including element B exclusively, and including element A and B are each contemplated. Furthermore, although some embodiments disclosed herein may achieve advantages over other possible solutions or over the prior art, whether or not a particular advantage is achieved by a given embodiment is not limiting of the scope of the present disclosure. Thus, the aspects, features, embodiments and advantages disclosed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

The flowchart illustrations and block diagrams in the Figures illustrate the architecture, functionality, and operation of possible implementations of systems, and methods according to various embodiments. It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

In view of the foregoing, the scope of the present disclosure is determined by the claims that follow.

We claim:

1. An apparatus comprising:
a plate coupled to an electrical ground node for electronic equipment;
a lug coupled to a physical ground node, the lug defining a plurality of apertures for receiving a plurality of bolts therethrough, the plurality of bolts for coupling the lug to a surface of the plate such that the lug contacts a conductive portion and an insulative portion of the plate, wherein coupling the lug to the surface electrically couples the electrical ground node to the physical ground node; and
a sensing circuit configured to:
detect whether the physical ground node is electrically coupled to the electrical ground node; and
provide an indication of whether the physical ground node is electrically coupled to the electrical ground node based on the detection.

2. The apparatus of claim 1, wherein the plate comprises a chassis of the electronic equipment.

3. The apparatus of claim 1, wherein providing the indication comprises: enabling the electronic equipment to be operated in response to detecting that the physical ground node is electrically coupled to the electrical ground node.

4. The apparatus of claim 1, wherein detecting whether the physical ground node is electrically coupled to the electrical ground node comprises:
detecting whether a first bolt of the plurality of bolts is electrically coupled to a second bolt of the plurality of bolts.

5. The apparatus of claim 1, wherein the plate comprises:
one or more spring-loaded contacts housed in the insulative portion and coupled to the electrical ground node, the one or more spring-loaded contacts configured to electrically couple the electrical ground node to the lug when the lug is coupled to the surface.

6. The apparatus of claim 1, wherein detecting whether the physical ground node is electrically coupled to the electrical ground node comprises:
sensing an impedance of a path between the physical ground node and the electrical ground node.

7. The apparatus of claim 1, wherein detecting whether the physical ground node is electrically coupled to the electrical ground node comprises sensing a voltage at one of the plurality of bolts.

8. The apparatus of claim 1, further comprising:
a plurality of deformable washers coupled to the plurality of bolts, wherein the plurality of deformable washers are compression calibrated to meet a specification of an amount of torque or more plurality of bolts.

9. The apparatus of claim 1, wherein providing the indication comprises:
providing an indication of whether the lug is coupled to the surface via a light-emitting diode (LED) or an alarm.

10. The apparatus of claim 9, wherein the sensing circuit comprises:
a press-fit pin that, in an inserted state, extends through the lug and the plate; and
a mechanical switch that is activated by the press-fit pin in the inserted state.

11. The apparatus of claim 9, wherein the sensing circuit comprises:
an optical sensor that extends through the plate and is coupled to the sensing circuit.

12. The apparatus of claim 1,
wherein the conductive portion comprises a metal insert,
wherein the insulative portion comprises a plastic enclosure around portions of the plate,
wherein a first bolt of the plurality of bolts extends through the metal insert, and
wherein a second bolt of the plurality of bolts extends through the plastic enclosure and is coupled to the sensing circuit.

13. The apparatus of claim 1,
wherein the conductive portion comprises a sheet metal enclosure,
wherein the insulative portion comprises an insulating sheet of the plate;
wherein a first bolt of the plurality of bolts extends through the sheet metal enclosure, and
wherein a second bolt of the plurality of bolts extends through the insulating sheet and is coupled to the sensing circuit.

14. The apparatus of claim 1,
wherein the conductive portion comprises a sheet metal enclosure, wherein the insulative portion comprises an insulating sheet of the plate;
wherein a first bolt of the plurality of bolts extends through the sheet metal enclosure, and
wherein a press-fit metal insert extends through the insulating sheet and is coupled to the sensing circuit.

15. A method comprising:
detecting whether a physical ground node is electrically coupled to an electrical ground node for electronic equipment, wherein a lug is coupled to the physical ground node, the lug defining a plurality of apertures for receiving a plurality of bolts therethrough, the plurality of bolts for coupling the lug to a surface of a plate, coupled to the electrical ground node, such that the lug contacts a conductive portion and an insulative portion of the plate, wherein coupling the lug to the surface electrically couples the electrical ground node to the physical ground node; and
providing an indication of whether the physical ground node is electrically coupled to the electrical ground node based on the detection.

16. The method of claim 15, wherein providing the indication comprises:
enabling the electronic equipment in response to detecting that the physical ground node is electrically coupled to the electrical ground node.

17. The method of claim 15, wherein detecting whether the physical ground node is electrically coupled to the electrical ground node comprises:
detecting whether a first bolt of the plurality of bolts is electrically coupled to a second bolt of the plurality of bolts.

18. The method of claim 15, wherein detecting whether the physical ground node is electrically coupled to the electrical ground node comprises:
sensing, via a pressure sensor, an amount of torque on the plurality of bolts.

19. An apparatus comprising:
a plate coupled to an electrical ground node for electronic equipment;
a circuit board coupled to the plate, the circuit board defining a plurality of apertures for receiving a plurality of bolts therethrough, the plurality of bolts for contacting the plate to an insulative surface of the circuit board, at least one of the plurality of bolts coupled to a physical ground node, wherein contacting the plate to the insulative surface electrically couples the electrical ground node to the physical ground node; and
a sensing circuit configured to:
detect whether the physical ground node is electrically coupled to the electrical ground node; and
provide an indication of whether the physical ground node is electrically coupled to the electrical ground node based on the detection.

20. The apparatus of claim 19, wherein the circuit board comprises a strain gauge.

* * * * *

UNITED STATES PATENT AND TRADEMARK OFFICE
CERTIFICATE OF CORRECTION

| | | |
|---|---|---|
| PATENT NO. | : 12,019,108 B2 | Page 1 of 1 |
| APPLICATION NO. | : 17/445999 | |
| DATED | : June 25, 2024 | |
| INVENTOR(S) | : Madhuri Chandrashekharaiah et al. | |

It is certified that error appears in the above-identified patent and that said Letters Patent is hereby corrected as shown below:

In the Claims

In Column 8, Line 30, in Claim 8, delete "or more" and insert -- on the --.

Signed and Sealed this
First Day of July, 2025

Coke Morgan Stewart
*Acting Director of the United States Patent and Trademark Office*